United States Patent
Liu et al.

(10) Patent No.: US 10,217,852 B1
(45) Date of Patent: Feb. 26, 2019

(54) HETEROJUNCTION BIPOLAR TRANSISTORS WITH A CONTROLLED UNDERCUT FORMED BENEATH THE EXTRINSIC BASE

(71) Applicant: GLOBALFOUNDRIES Inc., Grand Cayman (KY)

(72) Inventors: Qizhi Liu, Lexington, MA (US);
Vibhor Jain, Essex Junction, VT (US);
James W. Adkisson, Jericho, VT (US);
James R. Elliott, Huntington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/948,486

(22) Filed: Apr. 9, 2018

(51) Int. Cl.
| H01L 23/552 | (2006.01) |
| H01L 29/737 | (2006.01) |
| H01L 29/10 | (2006.01) |
| H01L 21/306 | (2006.01) |
| H01L 29/06 | (2006.01) |
| H01L 29/66 | (2006.01) |
| H01L 29/04 | (2006.01) |

(52) U.S. Cl.
CPC .... *H01L 29/7378* (2013.01); *H01L 21/30604* (2013.01); *H01L 29/04* (2013.01); *H01L 29/0649* (2013.01); *H01L 29/1004* (2013.01); *H01L 29/66242* (2013.01)

(58) Field of Classification Search
CPC .......... H01L 21/76846; H01L 23/5252; H01L 21/76847
See application file for complete search history.

(56) References Cited

U.S. PATENT DOCUMENTS

| 8,067,290 B2 | 11/2011 | Boeck et al. |
| 9,070,734 B2 | 6/2015 | Camillo-Castillo et al. |
| 9,159,817 B2 | 10/2015 | Camillo-Castillo et al. |
| 9,245,951 B1 | 1/2016 | Camillo-Castillo et al. |
| 9,318,551 B2 | 4/2016 | Camillo-Castillo et al. |
| 9,368,608 B1 | 6/2016 | Camillo-Castillo et al. |

*Primary Examiner* — Elias M Ullah
(74) *Attorney, Agent, or Firm* — Thompson Hine LLP

(57) ABSTRACT

Device structures and fabrication methods for heterojunction bipolar transistors. A trench isolation region surrounds an active region that includes a collector, and a base layer includes a first section composed of a single-crystal semiconductor material that is arranged over the active region and a second section composed of polycrystalline semiconductor material that is arranged over the trench isolation region. A first semiconductor layer of the second section of the base layer is removed selective to a second semiconductor layer of the second section of the base layer to define a gap arranged in a vertical direction between the second semiconductor layer of the second section of the base layer and the trench isolation region. An emitter is formed on the first section of the base layer.

20 Claims, 4 Drawing Sheets

HETEROJUNCTION BIPOLAR TRANSISTORS WITH A CONTROLLED UNDERCUT FORMED BENEATH THE EXTRINSIC BASE

BACKGROUND

The invention relates generally to semiconductor device and integrated circuit fabrication and, in particular, to device structures and fabrication methods for heterojunction bipolar transistors.

A bipolar junction transistor is a three-terminal electronic device that includes an emitter, an intrinsic base, and a collector in its construction. The intrinsic base is arranged between the emitter and collector in the device structure. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by a silicon germanium (SiGe) alloy, which is characterized by a narrower band gap than silicon.

Improved structures and fabrication methods for heterojunction bipolar transistors are needed.

SUMMARY

In an embodiment of the invention, a device structure is provided for a heterojunction bipolar transistor. The device structure includes a trench isolation region surrounding an active region, a collector in the active region, a base layer including a first section composed of a single-crystal semiconductor material that is arranged over the active region and a second section composed of polycrystalline semiconductor material that is arranged over the trench isolation region, and an emitter on the first section of the base layer. The second section of the base layer is spaced in a vertical direction from the trench isolation region to define a gap.

In an embodiment of the invention, a method of fabricating a heterojunction bipolar transistor is provided. The method includes forming a trench isolation region surrounding an active region that includes a collector, and forming a base layer that includes a first section composed of a single-crystal semiconductor material that is arranged over the active region and a second section composed of polycrystalline semiconductor material that is arranged over the trench isolation region. The method further includes removing a first semiconductor layer of the second section of the base layer selective to a second semiconductor layer of the second section of the base layer to define a gap arranged in a vertical direction between the second semiconductor layer of the second section of the base layer and the trench isolation region, and forming an emitter on the first section of the base layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
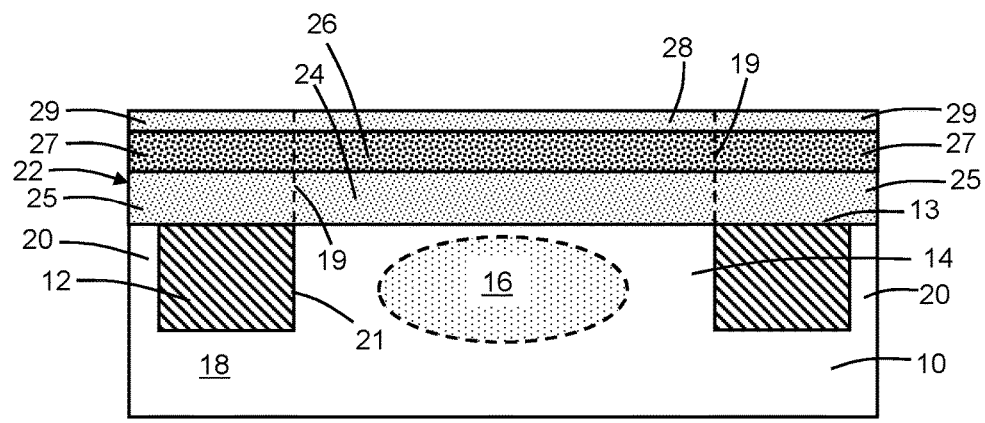
FIG. 1-5 are cross-sectional views of a device structure at successive fabrication stages of a processing method in accordance with embodiments of the invention.

With reference to FIG. 1 and in accordance with embodiments of the invention, a substrate 10 is composed of a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single-crystal silicon may be epitaxially grown on the substrate 10 and doped with an n-type dopant from Group V of the Periodic Table (e.g., phosphorus (P) and/or arsenic (As)) to produce n-type conductivity.

A trench isolation region 12 is formed in the substrate 10 and surrounds an active region 14 of the substrate 10 arranged interior of the trench isolation region 12. The trench isolation region 12 may be formed by a shallow trench isolation (STI) technique that relies on a lithography and dry etching process to define trenches in the substrate 10, deposits a dielectric material to fill the trenches, and planarizes the dielectric material using a chemical mechanical polishing (CMP) process to remove dielectric material from the field. The dielectric material may be comprised of an electrical insulator, such as an oxide of silicon (e.g., silicon dioxide ($SiO_2$)), deposited by chemical vapor deposition (CVD).

A collector 16 is arranged in the active region 14 and may constitute all or a portion of the active region 14. The electrical conductivity of the collector 16 may be elevated relative to the substrate 10 by, for example, an ion implantation of an electrically-active dopant, such as an n-type dopant, into a central portion of the active region 14. A subcollector 18 extends laterally in the substrate 10 beneath the trench isolation region 12 in order to couple the collector 16 with a collector contact region 20 that is arranged outside of the trench isolation region 12. The subcollector 18 may be formed beneath the top surface of the substrate 10 by introducing an electrically-active dopant, such as an impurity species from Group V of the Periodic Table (e.g., phosphorus (P), arsenic (As), and/or antimony (Sb)) effective to impart an n-type conductivity. In one embodiment, the subcollector 18 may be formed by a masked high-current ion implantation followed by a high-temperature thermal anneal.

A base layer 22 is formed over the active region 14, the trench isolation region 12, and collector contact region 20. The base layer 22 may include a section with multiple layers 24, 26, 28 that are positioned in vertical alignment with the active region 14 and that directly contact the single-crystal semiconductor material of the active region 14. The base layer 22 may further include another section with multiple layers 25, 27, 29 that are arranged primarily over a top surface 13 of the trench isolation region 12 and that respectively adjoin the layers 24, 26, 28. The multiple layers 24, 26, 28 of the base layer 22 may be composed of single-crystal semiconductor material and the layers 25, 27, 29 of the base layer 22 may be composed of polycrystalline semiconductor material. The layers 25, 27, 29 of the base layer 22 surround the layers 24, 26, 28 of the base layer 22 and may respectively transition with the layers 24, 26, 28 along an interface 19. The interface 19 is arranged directly over an interface 21 along which the trench isolation region 12 adjoins and physically contacts the active region 14. The layer 25 adjoins the layer 24 at the interface 19 and is continuous with the layer 24, the layer 27 adjoins the layer 26 at the interface 19 and is continuous with the layer 26, and the layer 29 adjoins the layer 28 at the interface 19 and is continuous with the layer 28. The layers 25, 27, 29 of the base layer 22 may have a thickness that is greater than or equal to or less than the thickness of the layers 24, 26, 28 of the base layer 22. Although interface 19 is shown as a vertically oriented, the angle of transition from layers 24, 26, 28 to layers 25, 27, 29 could be at a different angle that is less than or greater than 90°.

The layer 26 and layer 27 of the base layer 22 may be comprised of a semiconductor material, such as silicon-germanium (SiGe) including silicon (Si) and germanium (Ge) combined in an alloy with the silicon content ranging from 95 atomic percent to 50 atomic percent and the germanium content ranging from 5 atomic percent to 50 atomic percent. The germanium content of the layers 26 and 27 of the base layer 22 may be uniform or may be graded and/or stepped across their thickness. The layer 24 and layer 25 of the base layer 22 of the base layer 22 may be comprised of semiconductor material that lacks germanium and, in an embodiment, may be comprised entirely of silicon (Si). Similarly, the layer 28 and layer 29 of the base layer 22 may be comprised of semiconductor material that lacks germanium and, in an embodiment, may be comprised entirely of silicon (Si). The base layer 22 may be doped with a concentration of a dopant, such as a p-type dopant from Group III of the Periodic Table (e.g., boron (B) and/or indium (In)) that produces p-type conductivity.

The base layer 22 may be formed using a low temperature epitaxial growth process that is non-selective, such as rapid thermal chemical vapor deposition (RTCVD). Single-crystal semiconductor material (e.g., single-crystal silicon and/or single-crystal SiGe) epitaxially grows in the stacked layers 24, 26, 28, which are disposed on the active region 14, and polycrystalline semiconductor material forms in the stacked layers 25, 27, 29, which are disposed over the trench isolation region 12. The crystal structure of the single-crystal semiconductor material of the active region 14 serves as a crystalline template for the growth of the crystal structure of the layers 24, 26, 28 of the base layer 22 as the composition is modulated during growth, whereas the trench isolation region 12 does not provide any type of crystalline template during the formation of the layers 25, 27, 29 of the base layer 22.

Figure 2:
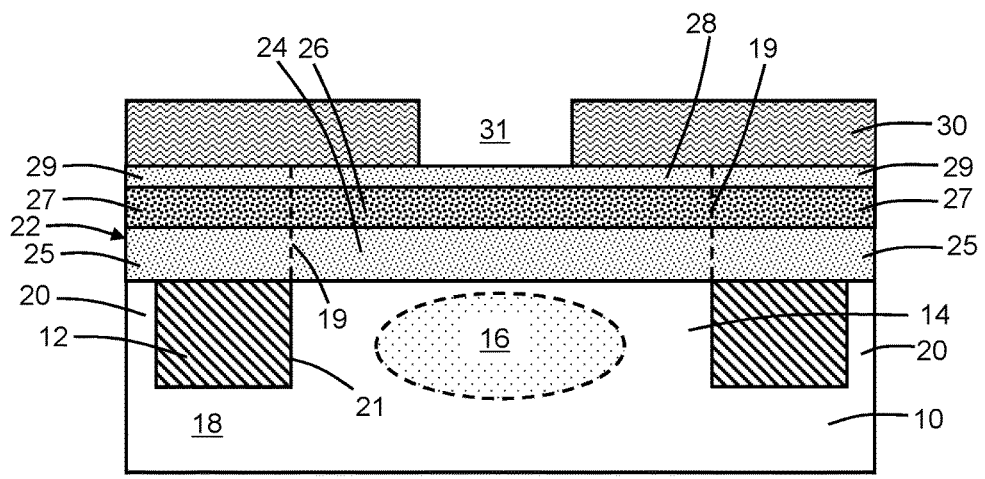

With reference to FIG. 2 in which like reference numerals refer to like features in FIG. 1 and at a subsequent fabrication stage of the processing method, one or more dielectric layers 30 may be formed on the base layer 22 and patterned using photolithography and etching processes to define an emitter window 31. The emitter window 31 is aligned with the layers 24, 26, 28 of the base layer 22.

Figure 3:
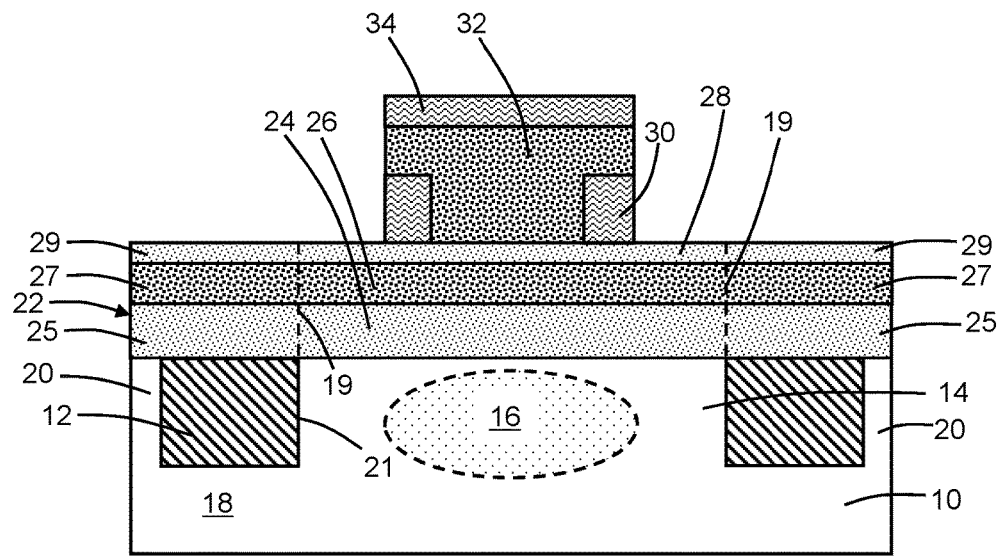

With reference to FIG. 3 in which like reference numerals refer to like features in FIG. 2 and at a subsequent fabrication stage of the processing method, an emitter 32 and an emitter cap 34 are formed by depositing a semiconductor layer that fills the emitter window 31 and covers the dielectric layers 30, depositing a cap layer on the deposited semiconductor layer, forming an etch mask that masks these deposited layers over the emitter window 31, and etching with reactive ion etching (RIE) to pattern the emitter 32 and emitter cap 34. The emitter 32 may be composed of polycrystalline semiconductor material, such as polycrystalline silicon, deposited by chemical vapor deposition (CVD). In an embodiment, the semiconductor material constituting the emitter 32 may be doped with an n-type dopant from Group V of the Periodic Table (e.g., phosphorus (P) and/or arsenic (As)) to provide n-type conductivity. The emitter cap 34 may be composed of a dielectric material, such as silicon nitride ($Si_3N_4$).

Figure 4:
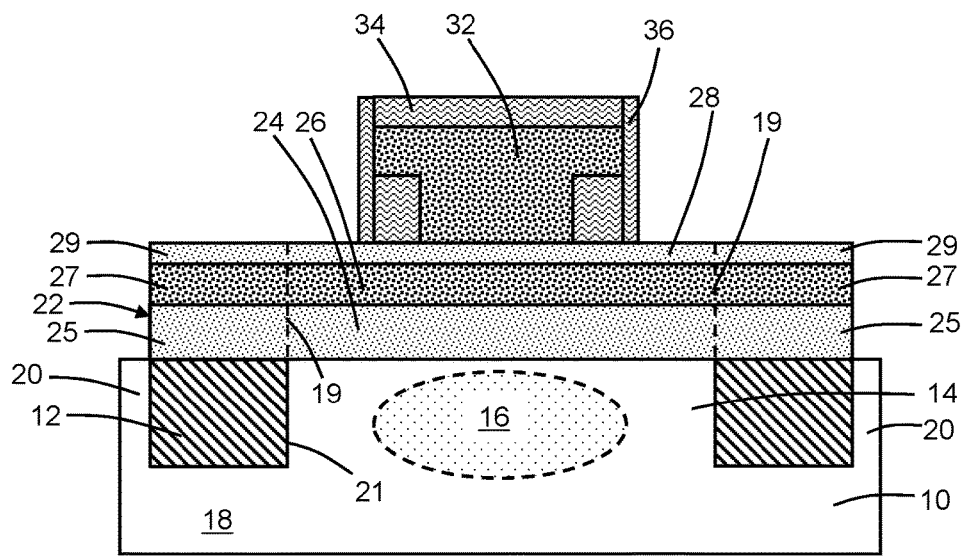

With reference to FIG. 4 in which like reference numerals refer to like features in FIG. 3 and at a subsequent fabrication stage of the processing method, a sidewall spacer 36 is formed that extends about the outer perimeter of the sidewalls of the emitter 32 and emitter cap 34. The sidewall spacer 36 may be composed of a dielectric material, such as silicon nitride ($Si_3N_4$), deposited as a conformal layer by atomic layer deposition (ALD) or chemical vapor deposition (CVD) and etched with a directional etching process, such as reactive ion etching (ME). The layers 27, 29 of the base layer 22 are implanted with ions delivering a p-type dopant from Group V of the Periodic Table (e.g., boron (B) and/or indium (In)) under given implantation conditions (e.g., ion species, dose, kinetic energy, implantation angle) and annealed to activate the dopant. The implanted layers 27, 29 provide the heterojunction bipolar transistor with a low-resistance extrinsic base that can be used in subsequent fabrication stages for base contact formation. A lithography and etching process is used to remove sections of the layers 25, 27, 29 from over the collector contact region 20 of substrate 10.

Figure 5:
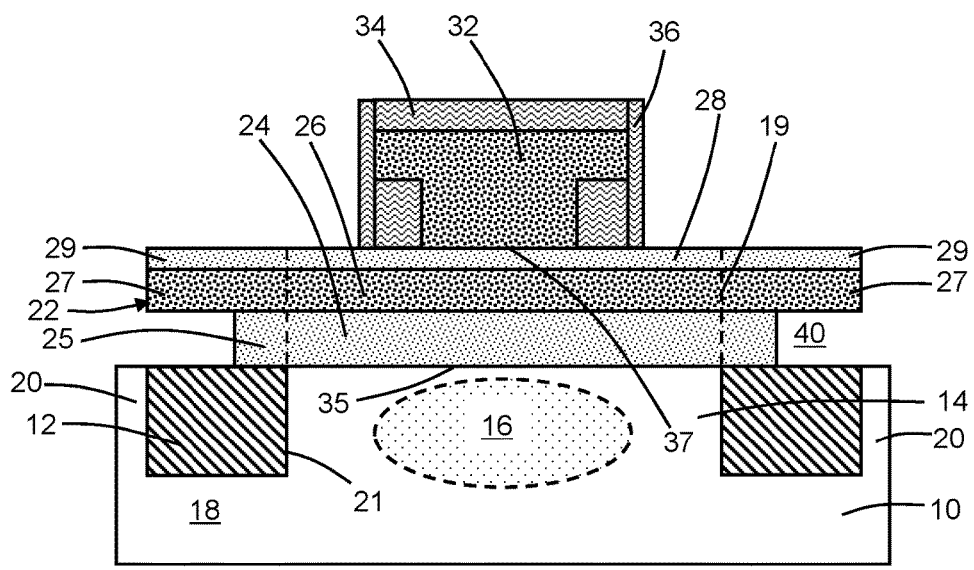

With reference to FIG. 5 in which like reference numerals refer to like features in FIG. 4 and at a subsequent fabrication stage of the processing method, the layer 25 of the base layer 22 may be partially removed with an isotropic etching process that etches the semiconductor material constituting the layer 25 of the base layer 22 selective to the semiconductor materials constituting the layer 27 and the layer 29 of the base layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The partial removal of the layer 25 of the base layer 22 forms a cavity 40 that has a height equal to the thickness of the layer 25 of the base layer 22. In an embodiment, the isotropic etching process etching and partially removing layer 25 of the base layer 22 may be a wet chemical etching process. In an embodiment, the layer 25 of the base layer 22 may be etched and partially removed using a solution containing a base substance, such as, for example, potassium hydroxide or ammonium hydroxide. The layer 27 of the base layer 22 is not etched because of the compositional difference arising from the germanium content, and the layer 29 of the base layer 22 is not etched because of the p-type doping so that the low base resistance is maintained. In an embodiment, the layer 27 of base layer 22 can also be partially etched if the concentration of germanium is low.

The emitter cap 34 and sidewall spacer 36 jointly mask the sidewall of the emitter 32, which is free of germanium and contains an n-type dopant, during the etching process.

The device structure of a heterojunction bipolar transistor 42 has a vertical architecture that includes the collector 16, the emitter 32, and an intrinsic base provided by the layers 24, 26, 28 of the base layer 22 that are arranged vertically between the emitter 32 and collector 16. A p-n junction 35 is arranged between the emitter 32 and the intrinsic base, and a p-n junction 37 is arranged between the intrinsic base and the collector 16. The device structure of the heterojunction bipolar transistor 42 can be divided into an intrinsic region that includes the p-n junctions 35, 37, and an extrinsic region that is arranged outside of the intrinsic region.

The heterojunction bipolar transistor 42 includes the layers 27 and 29 of the base layer 22 and the residual layer 25 of the base layer 22 as an extrinsic base that is used to contact the intrinsic base. The layers 27 and 29 of the base layer 22 are undercut by the cavity 40 in the extrinsic region, and is arranged over the trench isolation region 12. The height of the cavity 40 may be equal to the thickness of the removed portion of the layer 25 of the base layer 22, and the preservation of the layers 27 and 29 of the base layer 22 due to the selective etching process provides the portion of the extrinsic base undercut by the cavity 40 with a defined thickness. The height of the cavity 40 may be greater than or equal to the thickness of the layer 26 of the base layer 22.

Middle-of-line (MOL) processing and back-end-of-line (BEOL) processing follow, which includes formation of contacts, vias, and wiring for an interconnect structure coupled with the heterojunction bipolar transistor 42. The cavity 40 may be sealed by an interlayer dielectric layer 38 of the interconnect structure, as shown in FIG. 6, to form an airgap.

Figure 6:
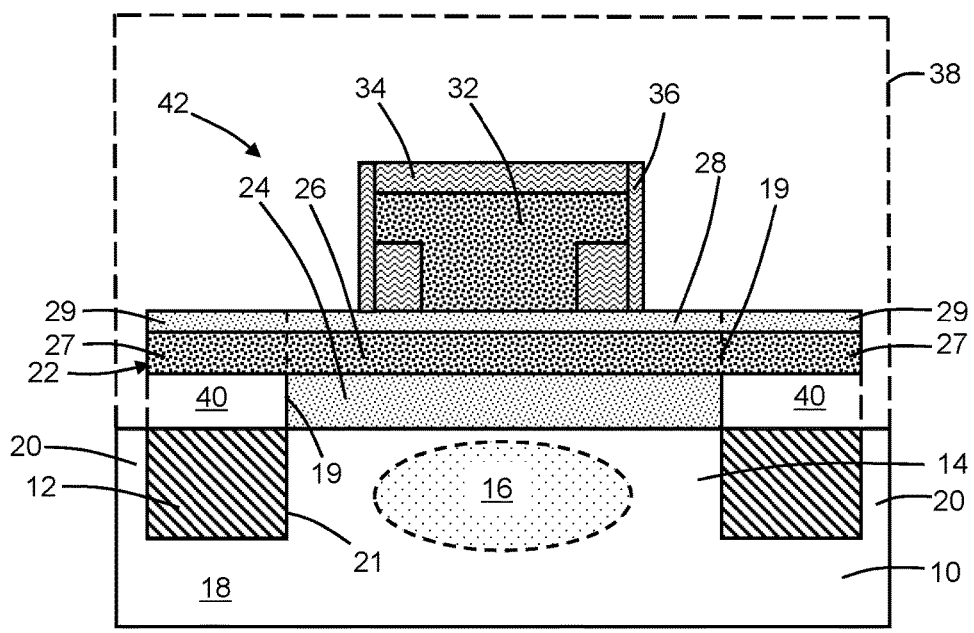
FIG. 6 is a cross-sectional view of a device structure in accordance with embodiments of the invention.

With reference to FIG. 6 in which like reference numerals refer to like features in FIG. 5 and in accordance with alternative embodiments, the layer 25 of the base layer 22 may be completely removed with the isotropic etching process to enlarge the cavity 40. The cavity 40 extends from the vertical outer edge of the layers 27, 29 of the base layer 22 to the interface 19 between polycrystalline semiconductor material and single-crystal semiconductor material.

Figure 7:
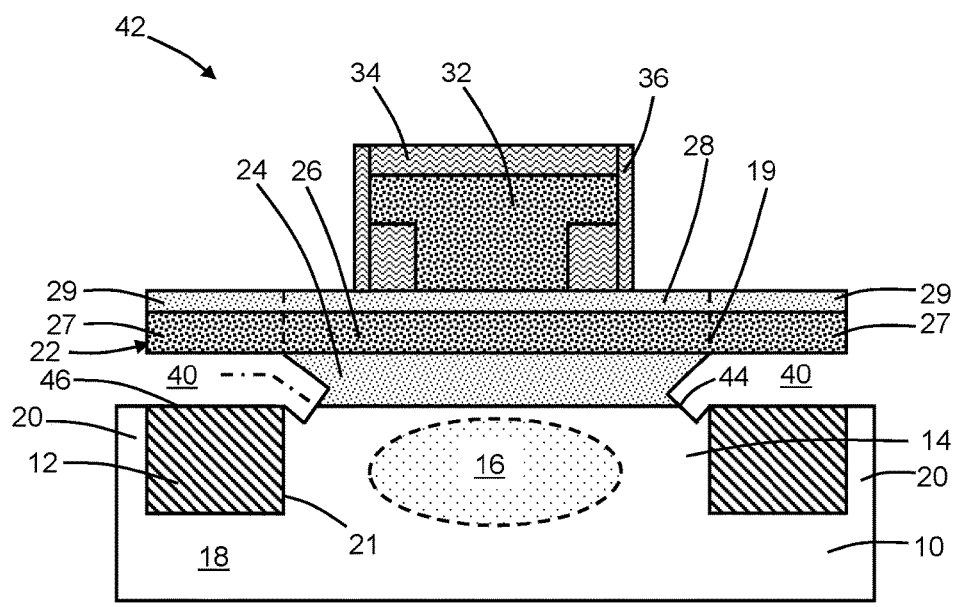
FIG. 7 is a cross-sectional view of a device structure in accordance with embodiments of the invention.

With reference to FIG. 7 in which like reference numerals refer to like features in FIG. 6 and in accordance with alternative embodiments, the isotropic etching process may be continued to further enlarge the cavity 40 by removing the single-crystal semiconductor material of the layer 24 of the base layer 22 and the single-crystal semiconductor material of the active region 14. In an embodiment, the isotropic etching process may exhibit a crystallographic orientation dependent in which the kinetics of the etching process may vary according to crystal plane and, in particular, may vary for different low-index crystal planes. Due to these variations in kinetics, the isotropic etching process may form angled surfaces 44 in (111) planes in the single-crystal semiconductor materials of the layer 24 of the base layer 22 and the active region 14, and may proceed at an etch rate that is less than the etch rate of the layer 25 of the base layer 22.

The cavity 40 includes a section over the trench isolation region 12 that has a uniform height and that extends beneath the layers 27, 29 of the base layer 22 (i.e., the extrinsic base) to the interface 19, as well as a section that is angled or inclined relative to the section beneath the layers 27, 29 of the base layer 22 toward the active region 14. The change in the orientation of the centerline of the cavity 40 for these different sections is indicated by the dot-dashed lines in FIG. 7. The angled section of the cavity 40 extends in part into layer 26 of the base layer 22 and in part into the active region 14 to a depth that is below the top surface 46 of the trench isolation region 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of a semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a heterojunction bipolar transistor, the device structure comprising:
   a trench isolation region surrounding an active region;
   a collector in the active region;
   a base layer including a first section that is arranged over the active region and a second section that is arranged over the trench isolation region, the first section of the base layer composed of a single-crystal semiconductor material, and the second section of the base layer composed of a polycrystalline semiconductor material; and
   an emitter on the first section of the base layer,
   wherein the second section of the base layer is spaced in a vertical direction from the trench isolation region to define a gap.

2. The device structure of claim 1 wherein the second section of the base layer includes a silicon-germanium layer, and the silicon-germanium layer of the second section of the base layer is arranged directly over the trench isolation region.

3. The device structure of claim 2 wherein the second section of the base layer includes a silicon layer, and the silicon-germanium layer of the second section of the base layer is arranged at the gap between the silicon layer of the second section of the base layer and the trench isolation region.

4. The device structure of claim 2 wherein the first section of the base layer includes a silicon-germanium layer, and the silicon-germanium layer of the second section of the base layer adjoins and is continuous with the silicon-germanium layer of the first section of the base layer.

5. The device structure of claim 1 wherein the first section of the base layer includes a silicon layer on the active region, and the gap extends beneath the second section of the base layer to the silicon layer of the first section of the base layer.

6. The device structure of claim 5 wherein the first section of the base layer and the second section of the base layer adjoin along a first interface, the trench isolation region adjoins the active region along a second interface, and the first interface is arranged directly over the second interface.

7. The device structure of claim 5 wherein the silicon layer of the first section of the base layer has a thickness, and the gap has a height that is greater than or equal to the thickness of the silicon layer of the first section of the base layer.

8. The device structure of claim 1 wherein the first section of the base layer includes a silicon layer on the active region, and the gap includes a first section that extends beneath the second section of the base layer to the silicon layer of the first section of the base layer and a second section that extends into the silicon layer of the first section of the base layer and the active region.

9. The device structure of claim 8 wherein the second section of the gap is angled relative to the first section of the gap.

10. The device structure of claim 9 wherein the trench isolation region has a top surface, and the second section of the gap extends into the silicon layer of the first section of the base layer and the active region to a depth that is below the top surface of the trench isolation region.

11. The device structure of claim 1 wherein the first section of the base layer has a first thickness, and the second section of the base layer has a second thickness that is less than the first thickness of the first section of the base layer.

12. A method of forming a heterojunction bipolar transistor, the method comprising:
    forming a trench isolation region surrounding an active region that includes a collector;
    forming a base layer that includes a first section composed of a single-crystal semiconductor material that is arranged over the active region and a second section composed of polycrystalline semiconductor material that is arranged over the trench isolation region;
    removing a first semiconductor layer of the second section of the base layer selective to a second semiconductor layer of the second section of the base layer to define a gap that is arranged in a vertical direction between the second semiconductor layer of the second section of the base layer and the trench isolation region; and
    forming an emitter on the first section of the base layer.

13. The method of claim 12 wherein the first semiconductor layer of the second section of the base layer is removed selective to the second semiconductor layer of the second section of the base layer with a wet chemical etching process.

14. The method of claim 13 wherein the first semiconductor layer of the second section of the base layer is composed of silicon, and the second semiconductor layer of the second section of the base layer is composed of silicon germanium.

15. The method of claim 13 wherein the first semiconductor layer of the second section of the base layer is partially removed with the wet chemical etching process.

16. The method of claim 13 wherein the first semiconductor layer of the second section of the base layer is completely removed with the wet chemical etching process.

17. The method of claim 12 wherein the first section of the base layer has a first thickness, and the second section of the base layer has a second thickness that is less than the first thickness of the first section of the base layer.

18. The method of claim 12 wherein the emitter includes a dielectric cap, and further comprising:
    before removing the first semiconductor layer of the second section of the base layer, forming a spacer composed of a dielectric material that masks a sidewall of the emitter beneath the dielectric cap.

19. The method of claim 12 wherein the first section of the base layer includes a silicon layer on the active region, the gap includes a first section that extends beneath the second section of the base layer and to the silicon layer of the first section of the base layer, and further comprising:
    etching the silicon layer of the first section of the base layer and the active region to form a second section of the gap that extends into the silicon layer of the first section of the base layer and the active region,
    wherein the second section of the gap is angled relative to the first section of the gap.

20. The method of claim 12 wherein the second section of the base layer includes a third semiconductor layer that is arranged over the second semiconductor layer of the second section of the base layer, the first semiconductor layer of the second section of the base layer has a first conductivity type, and further comprising:
    doping the third semiconductor layer of the second section of the base layer to have a second conductivity type,
    wherein the first semiconductor layer of the second section of the base layer is removed selective to the third semiconductor layer of the second section of the base layer.

* * * * *